(12) United States Patent
Koo et al.

(10) Patent No.: US 7,775,846 B2
(45) Date of Patent: Aug. 17, 2010

(54) METHOD OF MANUFACTURING A FLAT PANEL DISPLAY INCORPORATING A POWER SUPPLY LAYER AND A STORAGE CAPACITOR ELEMENT

(75) Inventors: Jae-Bon Koo, Yongin (KR); Dong-Chan Shin, hwaseong (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 544 days.

(21) Appl. No.: 11/634,934

(22) Filed: Dec. 7, 2006

(65) Prior Publication Data

US 2007/0077848 A1 Apr. 5, 2007

Related U.S. Application Data

(62) Division of application No. 10/292,627, filed on Nov. 13, 2002, now Pat. No. 7,173,372.

(30) Foreign Application Priority Data

Dec. 14, 2001 (KR) ................................ 2001-79579

(51) Int. Cl.
*H01L 51/56* (2006.01)
*H01L 21/02* (2006.01)
*H01L 21/70* (2006.01)

(52) U.S. Cl. ..................... 445/24; 438/34; 438/149; 438/151; 438/393

(58) Field of Classification Search ................. 445/24, 445/25; 313/500–512; 349/42, 43, 46; 438/34–35, 438/90, 149–166, 393–399
See application file for complete search history.

(56) References Cited

U.S. PATENT DOCUMENTS

| 5,734,449 | A | * | 3/1998 | Jang | 349/39 |
| 5,956,103 | A | * | 9/1999 | Ishiguro | 349/38 |
| 6,489,631 | B2 | * | 12/2002 | Young et al. | 257/72 |
| 6,542,205 | B2 | * | 4/2003 | Ohtani et al. | 349/47 |
| 6,583,472 | B1 | | 6/2003 | Shibata et al. | |
| 6,597,121 | B2 | | 7/2003 | Imura | |

(Continued)

FOREIGN PATENT DOCUMENTS

JP 04-003933 1/1992

(Continued)

OTHER PUBLICATIONS

U.S. Appl. No. 10/292,627, filed Nov. 13, 2002, Jae-Bon Koo et al., Samsung SDI Co., Ltd.

(Continued)

*Primary Examiner*—Maricela Santiago
(74) *Attorney, Agent, or Firm*—Stein McEwen, LLP

(57) ABSTRACT

A flat panel display device which is capable of preventing in-line shorts by forming as a face plate a common power line impressing an equal power supply to all pixels. The flat panel display includes a power supply layer formed on an insulation substrate and connected with source/drain electrodes through contact holes; and an insulating layer formed with a contact hole to insulate the power supply layer and a thin film transistor, wherein the thin film transistor is formed over the insulating layer and includes the source/drain electrodes.

11 Claims, 7 Drawing Sheets

U.S. PATENT DOCUMENTS

| | | |
|---|---|---|
| 6,597,413 B2 | 7/2003 | Kurashina |
| 6,614,174 B1 | 9/2003 | Urabe et al. |
| 6,835,954 B2 * | 12/2004 | Park et al. .................. 257/72 |
| 6,921,918 B2 | 7/2005 | Park et al. |
| 6,961,111 B1 | 11/2005 | Kuramasu |
| 7,256,534 B2 * | 8/2007 | Koo et al. .................. 445/24 |
| 2003/0193056 A1 | 10/2003 | Takayama et al. |

FOREIGN PATENT DOCUMENTS

| | | |
|---|---|---|
| WO | WO 01/82273 | 11/2001 |

OTHER PUBLICATIONS

Office Action issued in Chinese Patent Application No. 02151860.2.

\* cited by examiner

METHOD OF MANUFACTURING A FLAT PANEL DISPLAY INCORPORATING A POWER SUPPLY LAYER AND A STORAGE CAPACITOR ELEMENT

CROSS-REFERENCE TO RELATED APPLICATIONS

This application is a divisional application of U.S. application Ser. No. 10/292,627, filed Nov. 13, 2002, now U.S. Pat. No. 7,173,372, the disclosures of which are incorporated by reference. This application also claims the benefit of Korean Application No. 2001-79579, filed Dec. 14, 2001, in the Korean Industrial Property Office, the disclosure of which is incorporated herein by reference.

BACKGROUND OF THE INVENTION

1. Field of the Invention

The present invention relates to a flat panel display device, and more particularly, to an organic electroluminescent display device which is capable of preventing in-line shorts and dropping of a supply voltage by forming a common power supply layer as a face plate.

2. Description of Related Art

FIG. 1A illustrates the cross-sectional structure of a conventional organic electroluminescent display device. FIG. 1B illustrates the plan structure of a conventional organic electroluminescent display device. FIG. 1A illustrates the cross-sectional structure for one pixel region 15 as a cross-sectional structure taken along the line I-I of FIG. 1B.

Referring to FIG. 1A, a transparent insulation substrate 10 is divided into a first region 11 in which a pixel electrode is formed and a second region 12 in which a thin film transistor (TFT) and a capacitor are formed. A buffer layer 15 is formed on the insulation substrate 10, and a thin film transistor and a capacitor are formed in the second region 12 at the upper part of the buffer layer 15.

The thin film transistor is formed on the buffer layer 15 and equipped with a semiconductor layer 20 having source/drain regions 21 and 22, a gate electrode 31 on a gate insulating layer 30 and source/drain electrodes 51 and 52 which are formed on an interlayer insulating layer 40 so as to be respectively connected to the source/drain regions 21 and 22 through contact holes 41 and 42. The capacitor comprises a first electrode 32 formed on the gate insulating layer 30 and a second electrode 53 formed on the interlayer insulating layer 40 so as to be connected to the source electrode 51. A part interposed between the first and second electrodes 32 and 53 of the capacitor in the interlayer insulating layer 40 functions as a dielectric layer of the capacitor.

On the other hand, an organic electroluminescent display device is formed in the first region 11. The organic electroluminescent display device is equipped with a first pixel electrode 70 which is formed on a passivation layer 60 so as to be connected to the drain electrode 52 through a via hole 61, an organic electroluminescent EL layer 90 formed on the first pixel electrode 70 in an opening part 81 and a second pixel electrode 95 which is formed on a planarization layer 80 comprising the organic EL layer 90.

Referring to FIG. 1B, the organic electroluminescent display device is equipped with a plurality of signal lines, i.e., gate lines 35 used in selecting pixels, data lines 55 impressing data signals and power supply lines 56 giving a reference voltage required in driving a thin film transistor to drive by impressing an equal common voltage to all pixels.

Pixels are respectively arranged per each pixel regions limited by the signal lines 35, 55 and 56, wherein each of the pixels comprises a plurality of thin film transistors connected to the signal lines, for example, two transistors, one capacitor and an organic electroluminescent display device.

In fabricating a conventional organic electroluminescent display device, a first electrode 32 of capacitor and gate lines 35 are formed when forming the gate electrode 31 while a second electrode 53 of the capacitor, data lines 55, and power supply lines 56 are formed when forming the source/drain electrodes 51, 52, wherein one of the source/drain electrodes, for example, a source electrode 51 and a second electrode 53 of a capacitor are formed by being connected to the power supply lines 56.

Since the signal lines should be formed so that each of two signal lines are electrically separated on a layer as described above, there have been problems in that an in-line short (59 in FIG. 1B) occurs between data lines 55 and power supply lines 56 which are respectively adjacently arranged by conductive particles generated during the processing, and line defects are generated accordingly.

Furthermore, it is impossible to form a power supply line as a face plate, and the signal lines should be formed by patterning the power supply line in a line shape since each of the different two signal lines must exist on a layer. Accordingly, voltage drops are generated depending on positions to which a common voltage is impressed resulting in voltage non-uniformity, and resistance is increased due to line shape patterning resulting in a drop in voltage.

On the other hand, there have been problems in that the foregoing in-line shorts and drops in voltage are generated since two signal lines exist on one layer even in the case that the gate lines and power supply lines are formed at the same time while data lines are separately formed.

SUMMARY OF THE INVENTION

Accordingly, it is an object of the present invention to provide a flat panel display device preventing in-line shorts by forming a power supply line as a face plate, and a method of fabricating such a flat panel display device.

It is another object of the present invention to provide a flat panel display device which is capable of preventing a drop in supply voltage, and a method of fabricating such a flat panel display device.

Additional objects and advantages of the invention will be set forth in part in the description which follows and, in part, will be obvious from the description, or may be learned by practice of the invention.

The foregoing and other objects of the present invention are achieved by providing a flat panel display device comprising: a power supply layer formed on an insulation substrate and connected with source/drain electrodes through contact holes; and an insulating layer formed with a contact hole to insulate the power supply layer and a thin film transistor, wherein the thin film transistor is formed over the insulating layer and includes the source/drain electrodes.

The foregoing and other objects of the present invention may also be achieved by providing a method of fabricating a flat panel display device comprising: forming a power supply layer on an insulation substrate; forming an insulating layer on the power supply layer; forming a contact hole exposing a portion of the power supply layer by etching the insulating layer; and forming an island shaped conductive pattern connected to the power supply layer through the contact hole.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF THE INVENTION

Figure 1A:
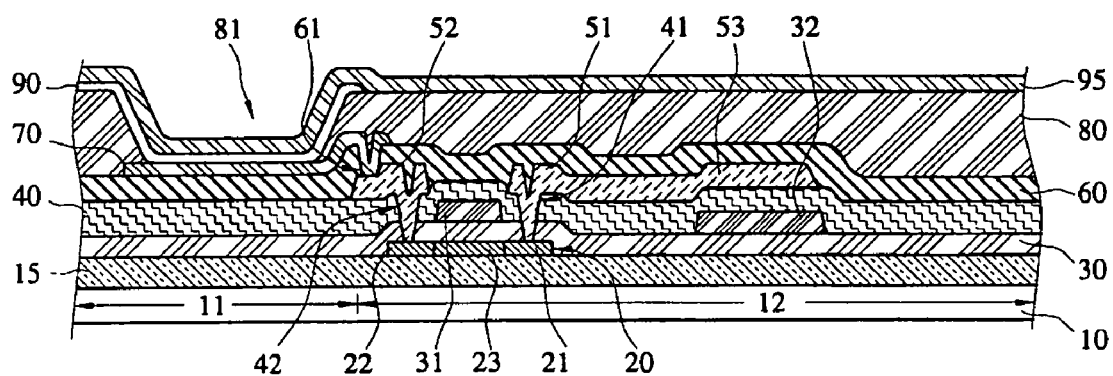
FIG. 1A is a cross-sectional view of a conventional organic electroluminescent display device.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 1B:
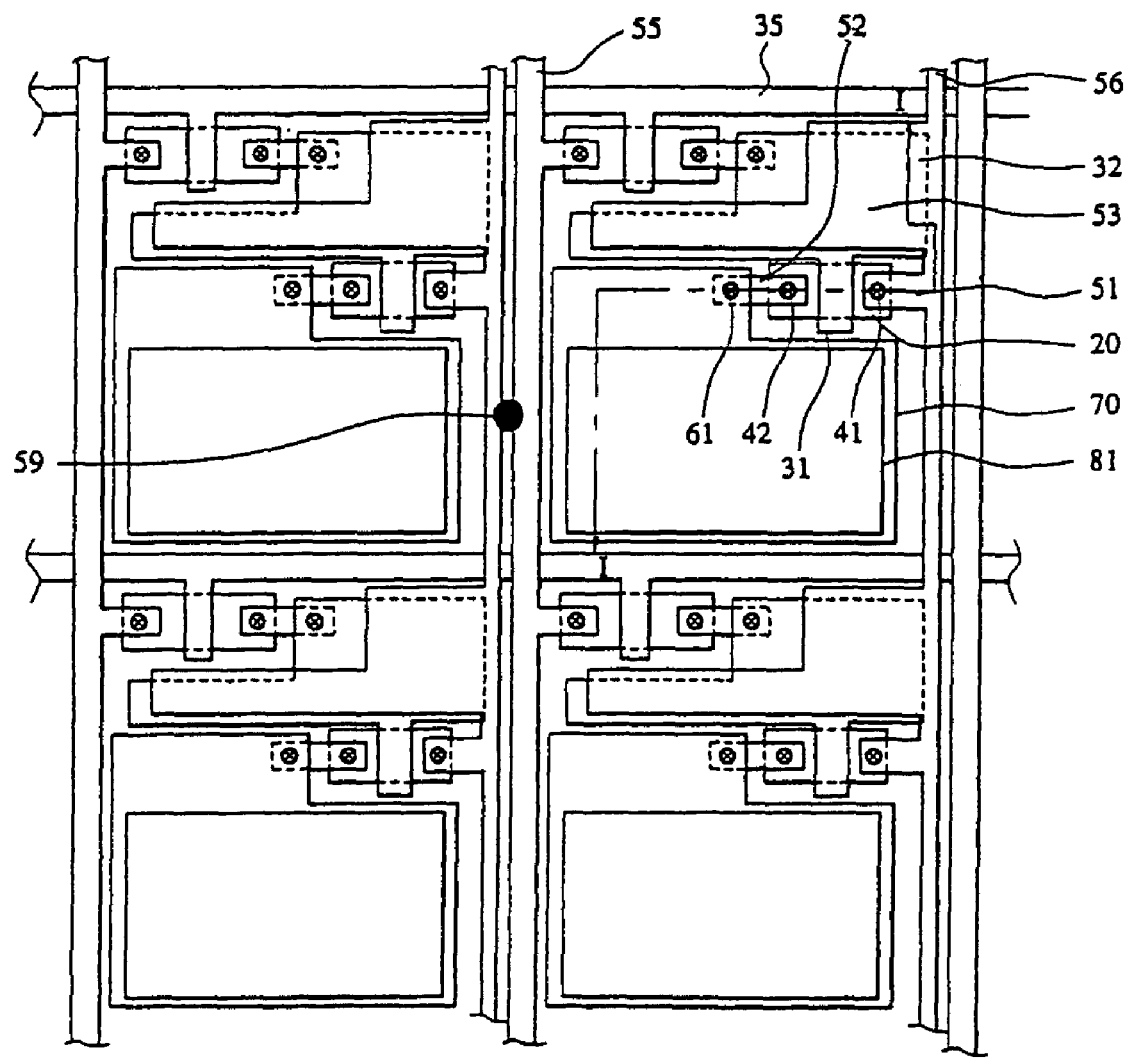
FIG. 1B is a plan view of a conventional organic electroluminescent display device.
Figure 2A:
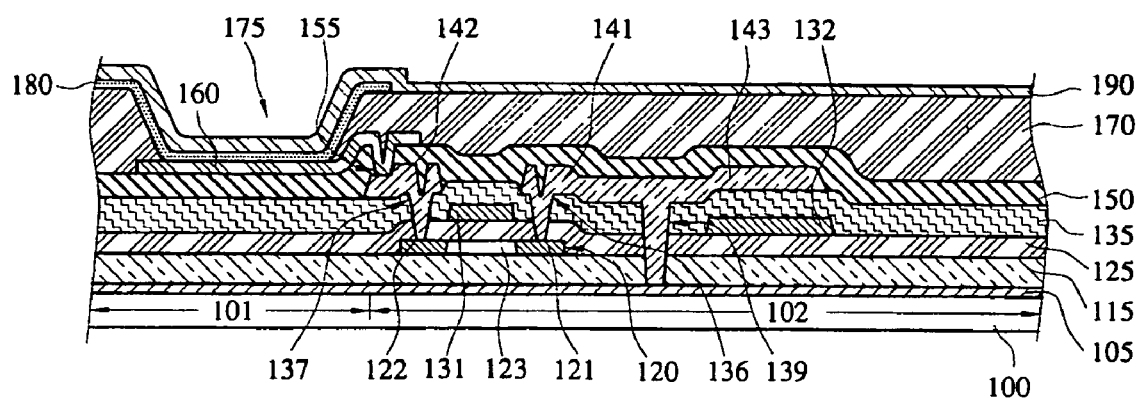
FIG. 2A is a cross-sectional view of an organic electroluminescent display device according to an embodiment of the present invention.
Figure 2B:
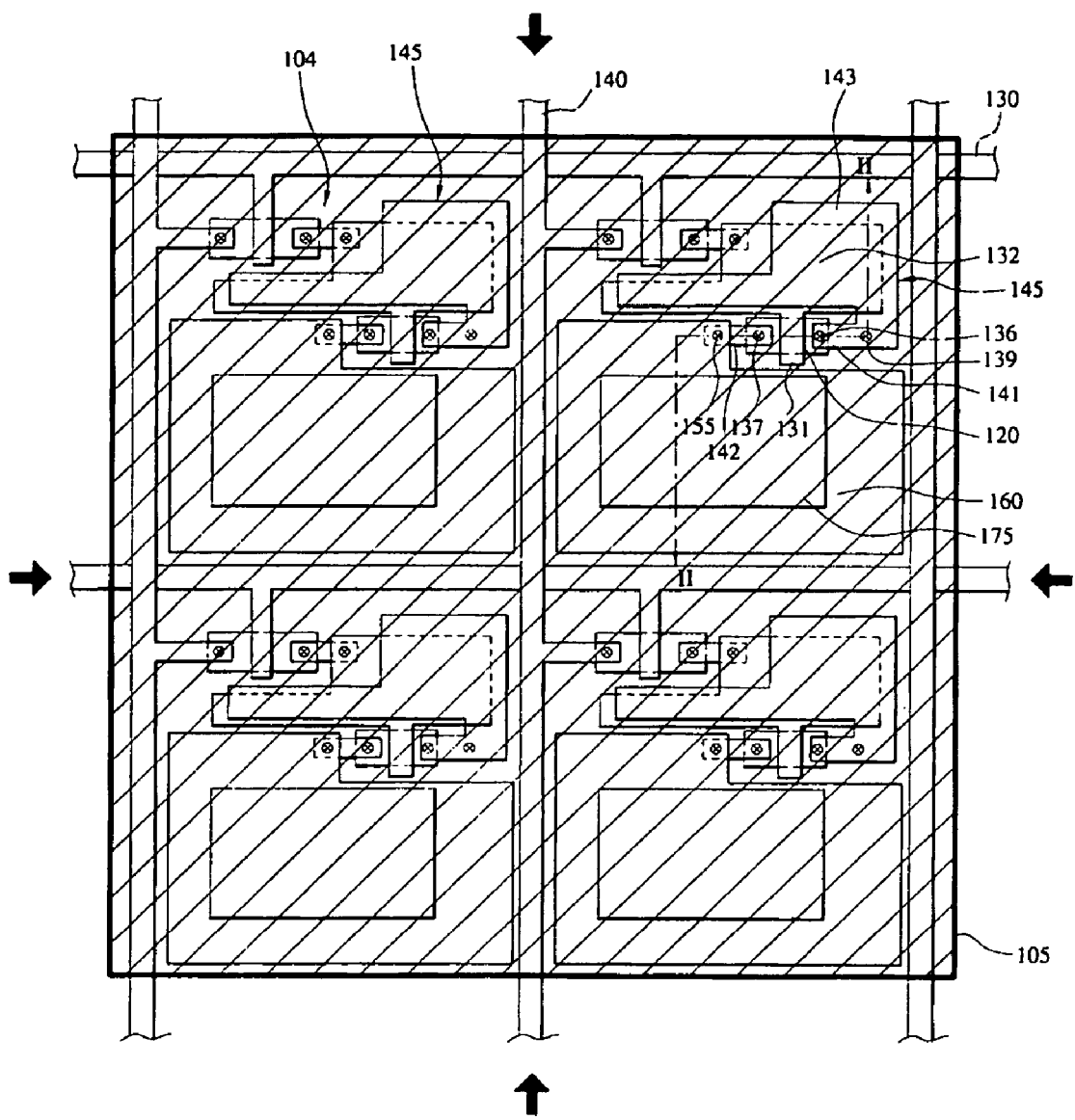
FIG. 2B is a plan view of an organic electroluminescent display device according to the embodiment of FIG. 2A.

FIG. 2A illustrates the cross-sectional view of an organic electroluminescent display device according to an embodiment of the present invention, and FIG. 2B illustrates the plan structure of an organic electroluminescent display device according to the embodiment of FIG. 1, wherein FIG. 2A, as a sectional structure taken along a line II-II of FIG. 2B, illustrates the cross-sectional view for one pixel region 104.

Referring to FIG. 2A and FIG. 2B, an insulation substrate 100 is provided, which is equipped with a first region 101 in which a pixel electrode is formed and a second region 102 in which a TFT and a capacitor are formed. A face plate type power supply layer 105 is formed by depositing an electrode material having a low resistance on the front surface of an insulation substrate 100. A buffer layer 115 is formed on the power supply layer 105 formed as a face plate.

A semiconductor layer 120 is formed on the buffer layer 115 of the second region 102, a gate insulating layer 125 is formed on the front surface of the substrate comprising the semiconductor layer 120, and a gate 131 and a first electrode 132 of the capacitor are simultaneously formed on the gate insulating layer 125 at the upper part of the semiconductor layer 120. Subsequently, source/drain regions 121 and 122 are formed by ion implanting one of n-type or p-type impurities into the semiconductor layer 120, wherein a part 123 of the semiconductor layer 120 below the gate 131 acts as a channel layer.

Successively, an interlayer insulating layer 135 is formed on the gate insulating layer 125 comprising the gate 131 and the first electrode 132 of the capacitor. First and second contact holes 136 and 137 respectively exposing the source/drain regions 121 and 122 and a third contact hole 139 exposing a portion of the power supply layer 105 are simultaneously formed by etching the interlayer insulating layer 135.

Source/drain electrodes 141 and 142 respectively contacting the source/drain regions 121, 122 through the first and second contact holes 136 and 137 and a second electrode 143 of the capacitor connected to one of the source/drain electrodes 141 and 142, for example, the source electrode 141, are simultaneously formed by patterning the deposited interlayer insulating layer 135 after depositing source/drain electrode materials on the interlayer insulating layer 135.

Therefore, one of the source/drain electrodes, e.g., the source electrode 141, and the second electrode 143 of the capacitor are connected to the power supply layer 105 of the face plate through the contact hole 139.

In one aspect of the present invention, a mask process is not added since a contact hole 139 to connect the power supply layer 105 to one of the source/drain electrodes is formed simultaneously when forming contact holes 136 and 137 for the source/drain electrodes.

Figure 4A:
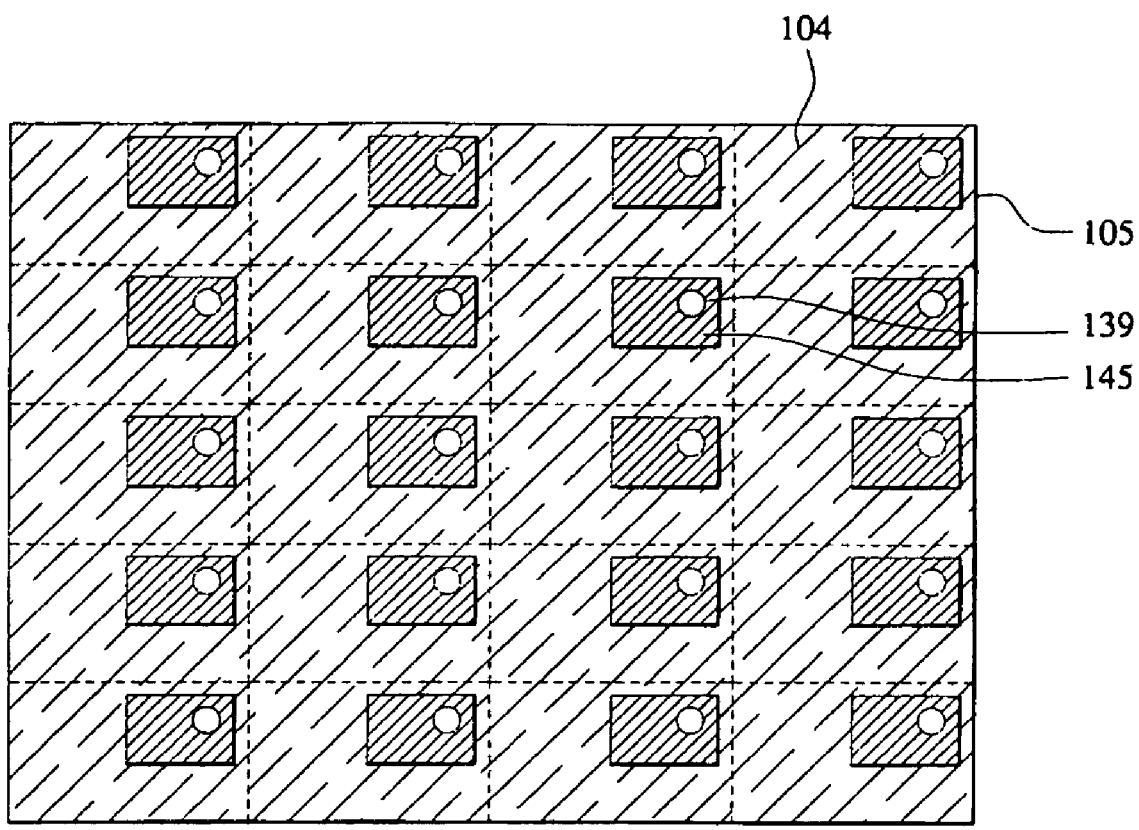
FIG. 4A is a drawing illustrating a connection structure between a power supply layer and source/drain electrodes according to the embodiment of FIG. 2A.

FIG. 4A illustrates the connection state between a face plate shaped power supply layer and source/drain electrodes according to this embodiment of the present invention. Referring to FIG. 4A, a power supply layer 105 is formed on the substrate in a face plate shape, a contact hole 139 exposing a portion of the power supply layer 105 is equipped at each pixel region 104, and an island shaped conductive pattern 145 is connected to the power supply layer 105 through the contact hole 139.

As illustrated in FIG. 2B, a part of the conductive pattern 145 acts as a source electrode 141 connected through the contact hole 139 while a residual part of the conductive pattern 145 acts as a second electrode 143 of the capacitor. That is, although a conventional organic electroluminescent display device has a structure wherein a second electrode 53 of the capacitor and a source electrode 51 are extended from a power supply line 56, as illustrated in FIG. 1B, a conductive pattern functioning as a source electrode 141 and a second electrode 143 of the capacitor has an island shape since the power supply layer 105 is formed in a face plate shape in an embodiment of the present invention.

A passivation layer 150 is formed on an interlayer insulating layer 135, the source/drain electrodes 141 and 142 and the second electrode 143 of the capacitor, with a via hole 155 exposing a portion of one of the source/drain electrodes 141 and 142, e.g., the drain electrode 142.

Subsequently, a pixel electrode 160, connected to the exposed drain electrode 142 through the via hole 155, is formed on the passivation layer 150, and a planarization layer 170 is deposited on the passivation layer 150 comprising the pixel electrode 160. An opening part 175 exposing a portion of the pixel electrode 160 is formed by etching the planarization layer 170. An EL layer 180 is formed in the opening part 175, and a cathode electrode is formed on the EL layer 180 as a transparent electrode 190.

The formation of a power supply layer 105 into a face plate shape does not affect the operation of the device since the organic electroluminescent display device of the present invention is a front light emitting type. Furthermore, a face plate structure can be adopted without affecting the operation of the device when forming the power supply layer 105 as a transparent face plate where the organic electroluminescent display device of the present invention is applied to a back light emitting structure.

Since a common power line is formed as a face plate in an embodiment of the present invention, as illustrated in FIG. 2B, not only a drop in supply voltage is minimized, but also non-uniformity of voltage depending on positions to which the voltage is impressed is prevented by impressing a common supply voltage to four directions, as shown by arrows.

Figure 4B:
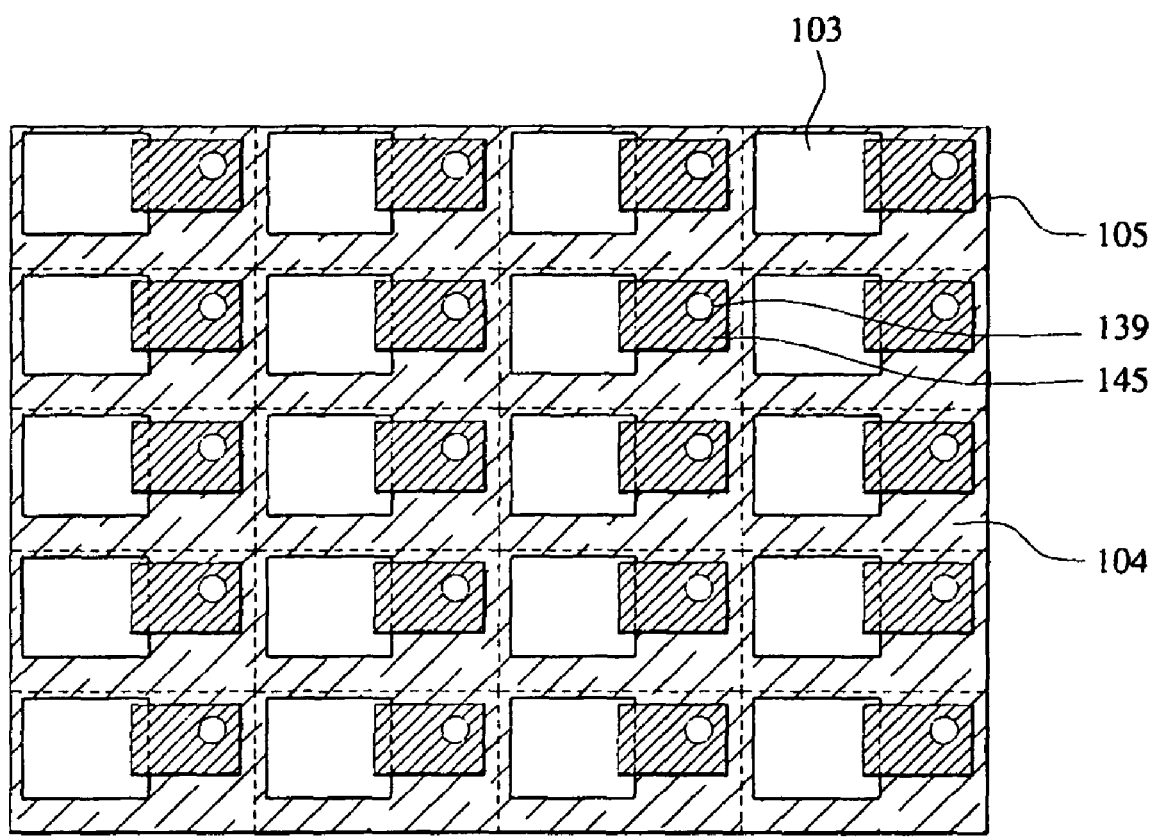
FIG. 4B is a drawing illustrating a connection structure between a power supply layer and source/drain electrodes according to another example of the present invention.

Although it is described above that a technology of the present invention using of a common power line as a face plate is applied to an organic electroluminescent display device, it can also be applied to an active matrix liquid crystal display device. Furthermore, although the present invention illustrates a structure in which a face plate is formed on a substrate at the lower part of a semiconductor layer, a formation position of the face plate can be altered according to the structure of a thin film transistor. Additionally, a part corresponding to a thin film transistor or electrodes in the power supply layer can be patterned so as to remove the effect of backside bias of the thin film transistor, as illustrated in FIG. 4B.

Figure 3:
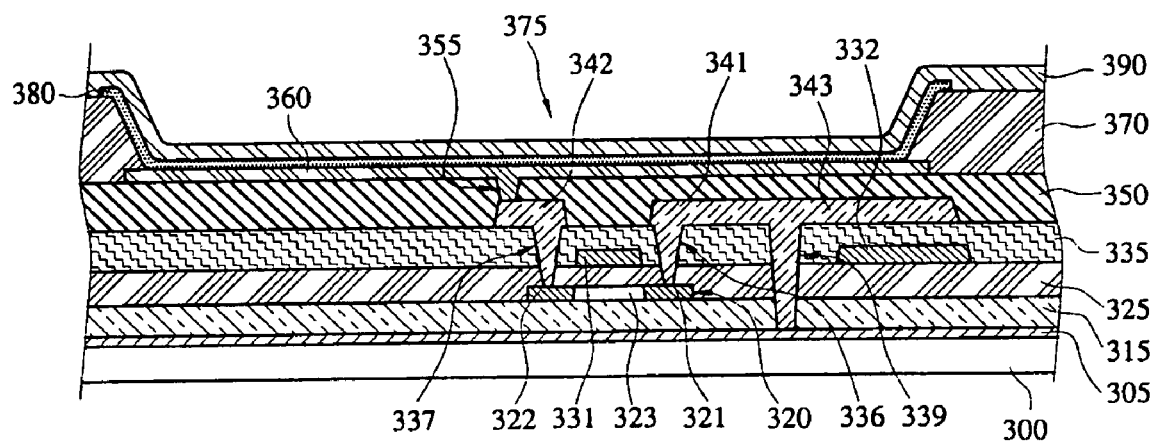
FIG. 3 is a cross-sectional view of an organic electroluminescent display device according to another embodiment of the present invention.

In a back light emitting structure, a pixel electrode must be formed in regions other than TFT regions. However, in the case where an electroluminescent display device employs a face plate emitting structure, an opening ratio can be improved since a pixel electrode 360 may be formed over all pixel regions, as shown in FIG. 3.

The forgoing organic electroluminescent display device according to the embodiments of the present invention has merits in that in-line shorts and a drop in voltage are prevented by forming a common power supply layer in a face plate shape, and an additional mask process is not required by simultaneously forming contact holes to connect the common power line, the source/drain electrodes and the capacitor when forming the source/drain contact holes.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of fabricating a flat panel display device, comprising:
   forming a power supply layer on an insulation substrate;
   forming an insulating layer on the power supply layer;
   forming a contact hole exposing a portion of the power supply layer by etching the insulating layer; and
   forming an island shaped conductive pattern connected to the power supply layer through the contact hole, wherein the island shaped conductive pattern functions as a source/drain electrode of a thin film transistor and as an electrode of a capacitor.

2. The method according to claim 1, wherein a part of the power supply layer corresponding to the thin film transistor is patterned so as to remove an effect of backside bias.

3. The method according to claim 1, wherein the power supply layer comprises an opaque conductive material having a low resistance.

4. The method according to claim 1, wherein the power supply layer comprises a transparent conductive material having a low resistance.

5. A method of fabricating a flat panel display device, comprising:
   providing an insulation substrate having a first and second region;
   forming a power supply layer on the insulation substrate;
   forming a buffer layer on the power supply layer;
   forming a semiconductor layer on the buffer layer in the second region of the insulation substrate;
   forming a gate insulating layer enclosing the semiconductor layer;
   forming a gate and a first electrode of a capacitor simultaneously on the gate insulating layer;
   forming source and drain regions in the semiconductor layer;
   forming an interlayer insulating layer on the gate insulating layer enclosing the gate and the first electrode of the capacitor;
   simultaneously forming first and second contact holes in the interlayer insulating layer to expose a portion of the source and drain regions, respectively, and a third contact hole to expose the power supply layer;
   forming source and drain electrodes contacting the source and drain regions through the first and second contact holes, respectively, and wherein one of the source electrode or the drain electrode is connected to the power supply layer through the third contact hole, by depositing source/drain electrode materials on the interlayer insulating layer and patterning the interlayer insulating layer; and
   forming a passivation layer on the interlayer insulating layer, the source and drain electrodes and the second electrode of the capacitor with a via hole exposing a portion of one of the source and drain electrodes.

6. The method according to claim 5, wherein the source and drain regions are formed by ion implanting one of n-type and p-type impurities into the semiconductor layer such that a part of the semiconductor layer below the gate acts as a channel layer.

7. The method according to claim 5, wherein the first and second contact holes are formed by etching the interlayer insulating layer.

8. The method according to claim 5, further comprising forming a pixel electrode on the passivation layer such that the pixel electrode is connected to the drain electrode through a via hole.

9. The method according to claim 8, further comprising forming a planarization layer on the passivation layer and enclosing the pixel electrode.

10. The method according to claim 9, further comprising:
    forming an opening part by exposing a portion of the pixel electrode;
    forming an EL layer in the opening part; and
    forming a cathode electrode on the EL layer as a transparent electrode.

11. The method according to claim 10, wherein the exposing a portion of the pixel electrode is performed by etching the planarization layer.

* * * * *